(12) United States Patent
Zheng et al.

(10) Patent No.: US 10,879,843 B1
(45) Date of Patent: Dec. 29, 2020

(54) VOLTAGE-CONTROLLED OSCILLATORS

(71) Applicant: BESTECHNIC (SHANGHAI) CO., LTD., Shanghai (CN)

(72) Inventors: Tao Zheng, Shanghai (CN); Lu Chai, Shanghai (CN)

(73) Assignee: BESTECHNIC (SHANGHAI) CO., LTD., Shanghai (CN)

(*) Notice: Subject to any disclaimer, the term of this patent is extended or adjusted under 35 U.S.C. 154(b) by 0 days.

(21) Appl. No.: 16/891,524

(22) Filed: Jun. 3, 2020

(30) Foreign Application Priority Data

Apr. 3, 2020 (CN) .......................... 2020 1 0256961

(51) Int. Cl.
*H03B 5/12* (2006.01)
(52) U.S. Cl.
CPC ......... *H03B 5/1228* (2013.01); *H03B 5/1253* (2013.01); *H03B 5/1293* (2013.01); *H03B 5/1296* (2013.01)
(58) Field of Classification Search
CPC .................................................. H03B 5/1228
USPC .................................................. 331/117 FE
See application file for complete search history.

(56) References Cited

U.S. PATENT DOCUMENTS

| 9,490,745 B1* | 11/2016 | Toso | .................... H03B 5/1215 |
| 2014/0320215 A1* | 10/2014 | Staszewski | ............ H03B 5/124 |
| | | | 331/18 |

FOREIGN PATENT DOCUMENTS

| CN | 101483434 A | 7/2009 |
| CN | 203326954 U | 12/2013 |
| CN | 106664059 A | 5/2017 |
| CN | 110677127 A | 1/2020 |
| JP | 200527776 A | 10/2005 |

* cited by examiner

*Primary Examiner* — Joseph Chang
(74) *Attorney, Agent, or Firm* — Bayes PLLC

(57) ABSTRACT

Embodiments of voltage-controlled oscillators for wireless transmission of data are disclosed herein. In one example, an oscillator circuit includes an active network, a passive differential network coupled to the active network, and a tail tank connected to the active network through a low impedance point of the active network is disclosed. The active network is configured to generate an activating signal for sustaining oscillation of the oscillator circuit. The passive differential network has a first input impedance magnitude peak at a first frequency and a second input impedance magnitude peak at a second frequency. The tail tank circuit has a third input impedance magnitude peak at a third frequency.

20 Claims, 7 Drawing Sheets

100

VOLTAGE-CONTROLLED OSCILLATORS

CROSS-REFERENCE TO RELATED APPLICATIONS

This application claims the benefit of priority to Chinese Patent Application No. 202010256961.4, filed on Apr. 3, 2020, which is incorporated herein by reference in its entirety.

BACKGROUND

Embodiments of the present disclosure relate to voltage-controlled oscillators.

Loudspeakers, including headphones, have been widely used in daily life. Headphones are a pair of small loudspeaker drivers worn on or around the head over a user's ears, which convert an electrical signal to a corresponding sound.

Clock signals are widely used in wireless communications such as Global System for Mobile Communications (GSM), the communications between user devices and wireless headphones for modulation and demodulation of data etc. As the modulation of the data in wireless communication become more and more complicated, the requirement of clock signals with high phase noise performance (i.e., low phase noise in the clock signal) is getting stronger.

The most commonly used circuit for generating the clock signal is voltage-controlled oscillators (VCO). Conventional VCOs generate the clock signal by enforcing a pseudo-square voltage waveform around an LC tank by increasing the third-harmonic of the fundamental oscillation voltage through an impedance peak, other than the impedance peak about the first harmonic component (i.e., the fundamental frequency) of the fundamental oscillation voltage. Research shows that the larger the third-harmonic component to the fundamental frequency component ratio of the output signal is the sharper/steeper the falling edge (i.e., zero-crossing slope) of the pseudo-square voltage waveform can be. Thus, increasing the third-harmonic component to the fundamental frequency component ratio (e.g., by increasing the third-harmonic component) in the output signal would significantly improve the phase noise performance of the oscillator.

Moreover, for wireless communication, the third harmonic component of the fundamental oscillation voltage can be used as clock signal(s) for System on Chip(s) (SoC(s)), such as for modulation/demodulation, coding/decoding, transmitting/receiving the audio information etc. This can reduce the pulling effect caused by the power amplifier (PA) in the subsequent circuit by staggering the operating frequencies for different modules of the SoC (e.g., using different clock signals, not being a integer multiple for the clock signal used by the PA).

SUMMARY

Embodiments of systems and methods for generating an oscillating signal are disclosed herein.

In one example, an oscillator circuit includes an active network, a passive differential network coupled to the active network, and a tail tank connected to the active network through a low impedance point of the active network is disclosed. The active network is configured to generate an active signal for sustaining oscillation of the oscillator circuit. The passive differential network has a first input impedance magnitude peak at a first frequency and a second input impedance magnitude peak at a second frequency. The tail tank circuit has a third input impedance magnitude peak at a third frequency.

In another example, a VCO includes a pair of transistors, a tank circuit including a transformer operatively coupled to the pair of transistors, and a tail tank circuit connected to the pair of transistors at a low impedance point of the VCO is disclosed. The pair of transistors is configured to generate an activating signal for sustaining oscillation of the VCO. The tank circuit has a first input impedance magnitude peak at substantially a first harmonic frequency of the VCO and a second input impedance magnitude peak at substantially a third harmonic frequency of the VCO. The tail tank circuit has a third input impedance magnitude peak at substantially a second or fourth harmonic frequency of the VCO.

In still another example, a method for generating an oscillating signal is disclosed. The method includes generating, by an active network, an activating signal for sustaining oscillation of an oscillator circuit and generating, by a passive differential network operatively coupled to the active network, a pseudo-square voltage waveform, wherein the passive differential network has a first input impedance magnitude peak at a first frequency and a second input impedance magnitude peak at a second frequency. The method further includes increasing a third harmonic component of a fundamental frequency in the passive differential network using a tail tank circuit connected to the active network through a low impedance point of the active network.

This Summary is provided merely for purposes of illustrating some embodiments to provide an understanding of the subject matter described herein. Accordingly, the above-described features are merely examples and should not be construed to narrow the scope or spirit of the subject matter in this disclosure. Other features, aspects, and advantages of this disclosure will become apparent from the following Detailed Description, Figures, and Claims.

BRIEF DESCRIPTION OF THE DRAWINGS

The accompanying drawings, which are incorporated herein and form part of the specification, illustrate the presented disclosure and, together with the description, further serve to explain the principles of the disclosure and enable a person of skill in the relevant art(s) to make and use the disclosure.

Figure 1:
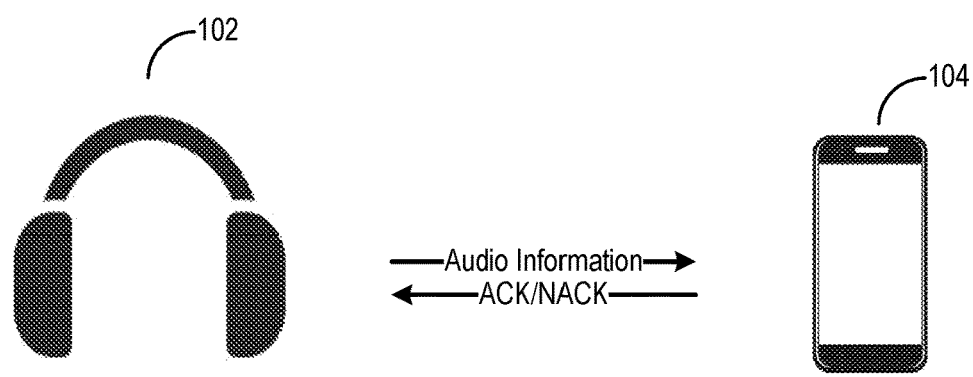
FIG. 1 is a block diagram illustrating an exemplary headphone system in accordance with some embodiments.

The presented disclosure is described with reference to the accompanying drawings. In the drawings, generally, like reference numbers indicate identical or functionally similar elements. Additionally, generally, the left-most digit(s) of a reference number identifies the drawing in which the reference number first appears.

DETAILED DESCRIPTION

Although specific configurations and arrangements are discussed, it should be understood that this is done for illustrative purposes only. It is contemplated that other configurations and arrangements can be used without departing from the spirit and scope of the present disclosure. It is further contemplated that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure, or characteristic is described in connection with an embodiment, it is contemplated that such feature, structure, or characteristic may also be used in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Clock signals are widely used in wireless communications such as Global System for Mobile Communications (GSM) and the communications between user devices and wireless headphones for modulation and demodulation of data. Oscillators of high spectral purity and low power consumption are quite challenging, especially for GSM transmitter (TX), where the oscillator phase noise must be less than −162 dBc/Hz at 20 MHz offset frequency from 915 MHz carrier. On the other hand, a Radio Frequency (RF) oscillator consumes a disproportionate amount of power of an RF frequency synthesizer and burns more than 30 % of the cellular receiver (RX) power. Thus, oscillators with low phase noise and high-power efficiency will greatly benefit the overall wireless communication.

VCOs generate the clock signal based on enforcing a pseudo-square voltage waveform to decrease the noise factor of the clock signal. The pseudo-square waveform is based on mixing an odd harmonic component (e.g., mainly third harmonic component) with a first harmonic component (i.e., the fundamental frequency) in the clock signal. Research shows that the pseudo-square waveform with sharper/steeper falling edge (i.e., zero-crossing slope) has the better phase noise performance and power efficiency of the oscillator can be achieved. Research also shows that the higher the third harmonic component to the first harmonic component ratio is the sharper/steeper the falling edge of the pseudo-square waveform can have. This is calling for a circuit-to-phase-noise conversion mechanism that can generate output signals with a larger third harmonic component to the first harmonic component ratio, under similar working conditions (e.g., at the same supply voltage and having substantially the same output swing of the clock signal).

Moreover, the third harmonic component of the fundamental oscillation voltage can be used as clock signal(s) for the processing modules of System on Chip(s) (SoC(s)) for wireless communication, for avoiding pulling effects caused by power amplifier(s) (PA(s)) in subsequent circuits. For example, the third harmonic component of the fundamental oscillation voltage can be used as clock signal(s) for modules such as modulation/demodulation, coding/decoding, transmitting/receiving the audio information etc. In some embodiments, the PA may be working on a 3/2 or 3/4 times of the fundamental harmonic frequency of the VCO (e.g., using a frequency divider for generating such a clock signal), such that the PA will not affect the other processing modules by staggering the operating frequencies for different modules of the SoC (e.g., using different clock signals, not being a integer multiple for the clock signal used by the PA). This can further improve the accuracy of the SoC for processing the audio information.

The third harmonic component of the fundamental oscillation voltage is realized by adding an auxiliary impedance peak to the oscillator circuit. Conventional VOC realizes the auxiliary impedance peak by using a transformer with moderately coupled resonating windings (e.g., having a primary winding with an impedance at the frequency of the first harmonic component of the fundamental oscillation voltage, and a secondary winding with an impedance at the frequency of the third harmonic component of the fundamental oscillation voltage). For example, Masoud Babaie utilized a transformer-based resonator (i.e., a class-F oscillator) for generating the pseudo-square waveform. The resonator consists of a transformer with turns ratio n and tuning capacitors $C_1$ and $C_2$ at the transformer's primary and secondary windings. The oscillator realizes the two different resonant frequencies (e.g., the first and the third) by using the tank containing two different conjugate pole pairs. Thus, the input impedance has the two magnitude peaks at first and third resonant frequencies.

However, the third harmonic component to the first harmonic component ratio $V_{dH3}/V_{dH1}$ of the conventional class F oscillator is still undesirable (less than 0.3). Moreover, because conventional VCO applies the oscillator transconductance loop gain for both resonant frequencies (i.e., the first and the third resonant frequencies), the probability of generating undesired oscillation at the auxiliary tank input impedance is high, and thus reduce the robustness of the oscillator. To increase the $V_{dH3}/V_{dH1}$ while maintaining a moderate third resonant frequency voltage swing, and to avoid multi-oscillation behavior, a multi-level amplifier needs to be applied subsequently to the conventional class F oscillator. This would increase the complexity, power consumption, size, and cost of the oscillator. Accordingly, an oscillator that can generate an output signal with a higher $V_{dH3}/V_{dH1}$ while keeping the output swing range, without using a subsequent multi-level amplifier(s) is important.

As will be disclosed in detail below, among other novel features, VCO including an active network (e.g., a pair of transistors) configured to generate an activating signal for sustaining oscillation of the VCO, a passive differential network (e.g., a transformer including a primary and a secondary winding) having a first input impedance magnitude peak at substantially a first harmonic frequency of the VCO and a second input impedance magnitude peak at substantially a third harmonic frequency of the VCO, and a tail tank having a third input impedance magnitude peak at substantially a second and/or fourth harmonic frequency of the VCO, disclosed herein can achieve increasing the $V_{dH3}/V_{dH1}$ of the output signal while keeping the output swing range, without using subsequent multi-level amplifiers. This can lower the phase noise of the VCO under the same working conditions (e.g., having the same tank's quality factor and having the same supply voltage) and can increase the power efficiency by avoiding applying the subsequent multi-level amplifier.

In some embodiments, the output signal of the VCO disclosed herein can be used as the clock signal for wireless communication between a user device and a wireless headphone. For example, the wireless headphone can be a regular wireless headphone (e.g., with the wires between the left and right headphones) where the audio source (e.g., the user device such as a smart phone or a personal computer) can transmit the audio information to the wireless headphone based on the wireless communication. Or the wireless headphone can be a true wireless (TWS) headphone (e.g., with no wire between the left and right headphones) where audio source can also be transmitted between a left headphone and a right headphone.

The audio information may be transmitted based on a wireless communication protocol such as Bluetooth communication, Wi-Fi, near-field magnetic induction, etc. Bluetooth is a wireless technology standard for exchanging data over short distances, and the Bluetooth protocol is one example of short-range wireless communication protocols. In some embodiments, audio information may be transmitted by the audio source to the wireless headphone according to the Wi-Fi protocol. Wi-Fi is a wireless technology for wireless local area networking based on the IEEE 802.11 standards, and the Wi-Fi protocol (also known as the 802.11 protocol) is another example of short-range wireless communication protocol. It is understood that the communication between the audio source to the wireless headphone may be any other suitable short-range wireless communication in addition to Bluetooth communication and Wi-Fi.

In some embodiments, audio information may be transmitted between the left and right headphone (e.g., by the left headphone to the right headphone and vice versa) using NFMI communication. NFMI communication is a short-range wireless communication by coupling a tight, low-power, non-propagating magnetic field between devices. As the magnetic field can easily penetrate the physical structures of the human head, signal attenuation caused by the human head can be significantly reduced for the communication between the left headphone and the right headphone.

When performing the wireless communication (e.g., the audio information transmission between the audio source and wireless headphone, and/or the audio information transmission between the left headphone and the right headphone), precise and robust clock signals with low phase noise are important for modulating, transmitting, receiving and demodulating the audio information. Imprecise and/or high phase noise clock signals may cause the risk of jitter (i.e., the timing error when reading the data) and reduce the data read accuracy (e.g., data misread caused by the timing error).

It is contemplated that being used as the clock signal for wireless communication between the audio source and the wireless headphone is only one application of the oscillating signal generated by the VCO disclosed herein. It is for illustrative purposes only, and not for limiting the application of the oscillating signal and the VCO disclosed herein. It is understood that the VCO and the oscillating signal disclosed herein can also be used for other purposes such as Global System for Mobile Communications (GSM), function generators, phase-locked loops (PLLs), music synthesizers, voltage-to-frequency converters, etc.

On the other hand, the RF oscillator consumes a disproportionate amount of power of an RF frequency synthesizer and burns more than 30% of the cellular RX power. Thus, oscillators with low phase noise and high-power efficiency will greatly benefit the overall wireless communication. Accordingly, oscillators of high spectral purity and low power consumption are important for GSM transmitter (TX), where the oscillator phase noise must be less than −162 dBc/Hz at 20 MHz offset frequency from 915 MHz carrier.

FIG. 1 is a block diagram illustrating an exemplary headphone system 100 in accordance with various embodiments. As illustrated in FIG. 1, headphone system 100 can include a user device 102 and a wireless headphone 104 (referred to as "headphone 104" hereinafter). In some embodiments, a wireless communication link (e.g., Bluetooth communication or Wi-Fi) can be established between user device 102 and headphone 104. Audio information may be transmitted from audio source 102 to headphone 104 according to the Bluetooth protocol or Wi-Fi protocol at the working RF band disclosed above.

User device 102 may be any suitable device that can provide data packets including video and/or audio information including, for example, video, music, or voice in the digital format. User device 102 may include, but is not limited to, a handheld device (e.g., dumb or smart phone, tablet, etc.), a wearable device (e.g., eyeglasses, wrist watch, etc.), a radio, a music player, an electronic musical instrument, an automobile control station, a gaming console, a television set, a laptop computer, a desktop computer, a netbook computer, a media center, a set-top box, a global positioning system (GPS), or any other suitable device.

Headphone 104 may be any electroacoustic transducers that convert an electrical signal (e.g., representing the audio information provided by audio source 102) to a corresponding sound. In some embodiments, headphone 104 can include two speakers connected by a cord. In some other embodiments, headphone 104 may be TWS headphones that include a primary headphone and a secondary headphone, each of which may be an earbud (also known as earpiece) that can plug into the user's ear canal.

As shown in FIG. 1, bidirectional communications may be achieved between audio source 102 and headphone 104. Audio source 102 may transmit audio information (e.g., in data packets) by a carrier wave to headphone 104. In some embodiments, audio information may be a stream of audio stereo information in the form of compressed or uncompressed stereo samples for first and second audio channels, such as left-channel audio information and right-channel audio information or the like. Headphone 104 may transmit acknowledgment packets (ACK) back to audio source 102 upon successful reception of the audio information from audio source 102 and may transmit negative acknowledgment packets (NACK) back to audio source 102 upon unsuccessful reception of the audio information.

In some embodiments, the audio information transmitted by the data packet may be a stream of audio stereo information in the form of compressed or uncompressed stereo samples for first and second audio channels, such as left-channel audio information and right-channel audio information or the like. In some embodiments, the audio information may be mono audio information in a single audio channel or audio information in more than two separate audio channels (e.g., left, central, and right channels).

In some embodiments, headphone 104 may include an analog-to-digital converter (ADC) for converting the data packet in digital form, a Radio Frequency (RF) module for receiving the data packet, a demodulation module for demodulating the data packet and an audio information codec for decoding the audio information from digital form to analog form. In some embodiments, the audio information codec may send the converted audio information (e.g., in analog form) to a speaker for playing.

In some embodiments, an oscillator (e.g., a voltage-controlled oscillator) can be used for generating clock signals (e.g., a local clock) for headphone 104 to demodulate the data packet. For example, the oscillator may generate the clock signal based on enforcing a pseudo-square voltage waveform around LC tank(s) by increasing a third harmonic of the fundamental oscillation voltage through an additional impedance peak. This auxiliary impedance peak may be realized by a transformer with moderately coupled resonating windings, as will be disclosed in greater detail below. For example, FIGS. 2A-2C are circuit diagrams illustrating exemplary VCOs in accordance with various embodiments.

Figure 2A:
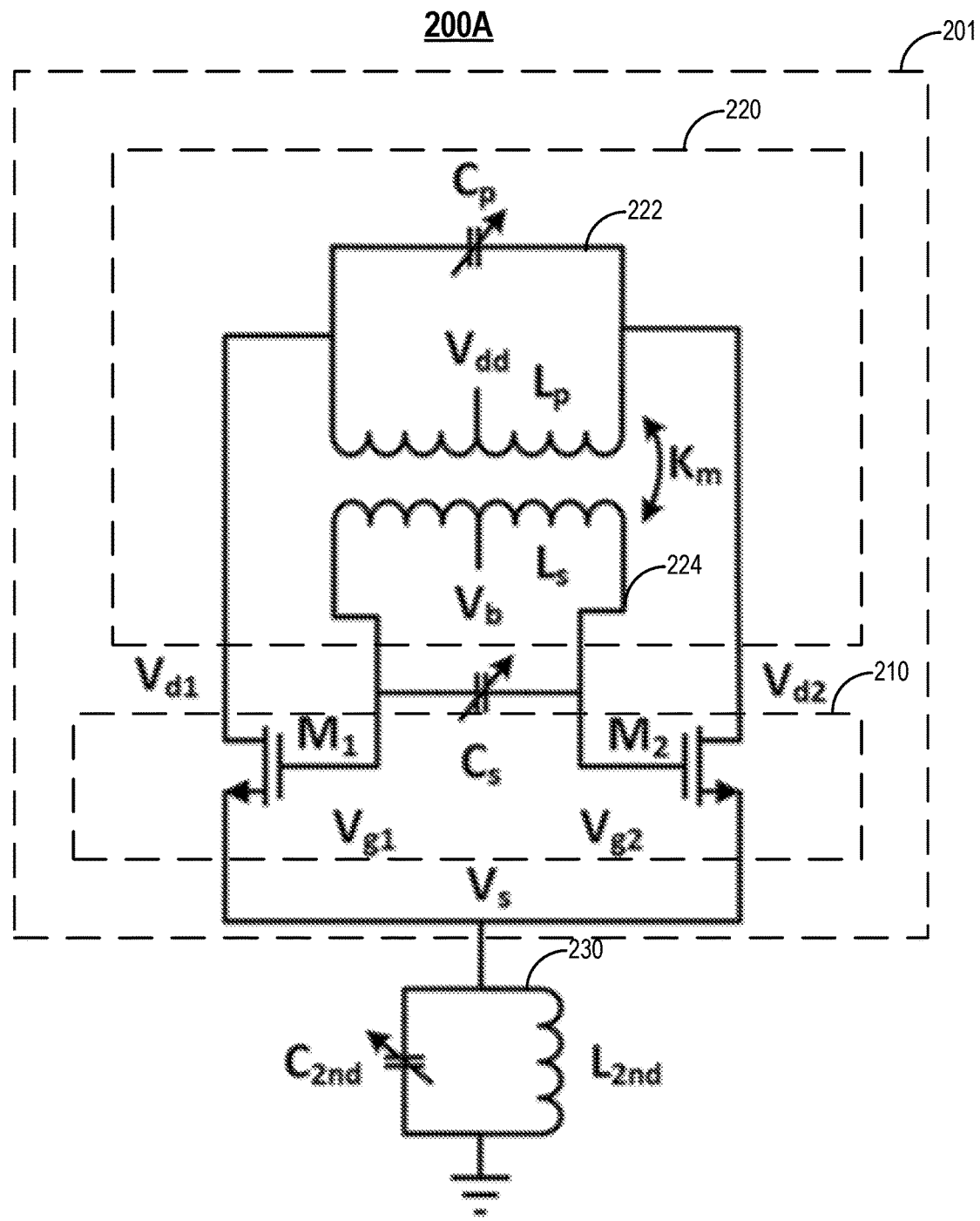
FIGS. 2A-2C are circuit diagrams illustrating various exemplary VCOs in accordance with various embodiments.
Figure 2B:
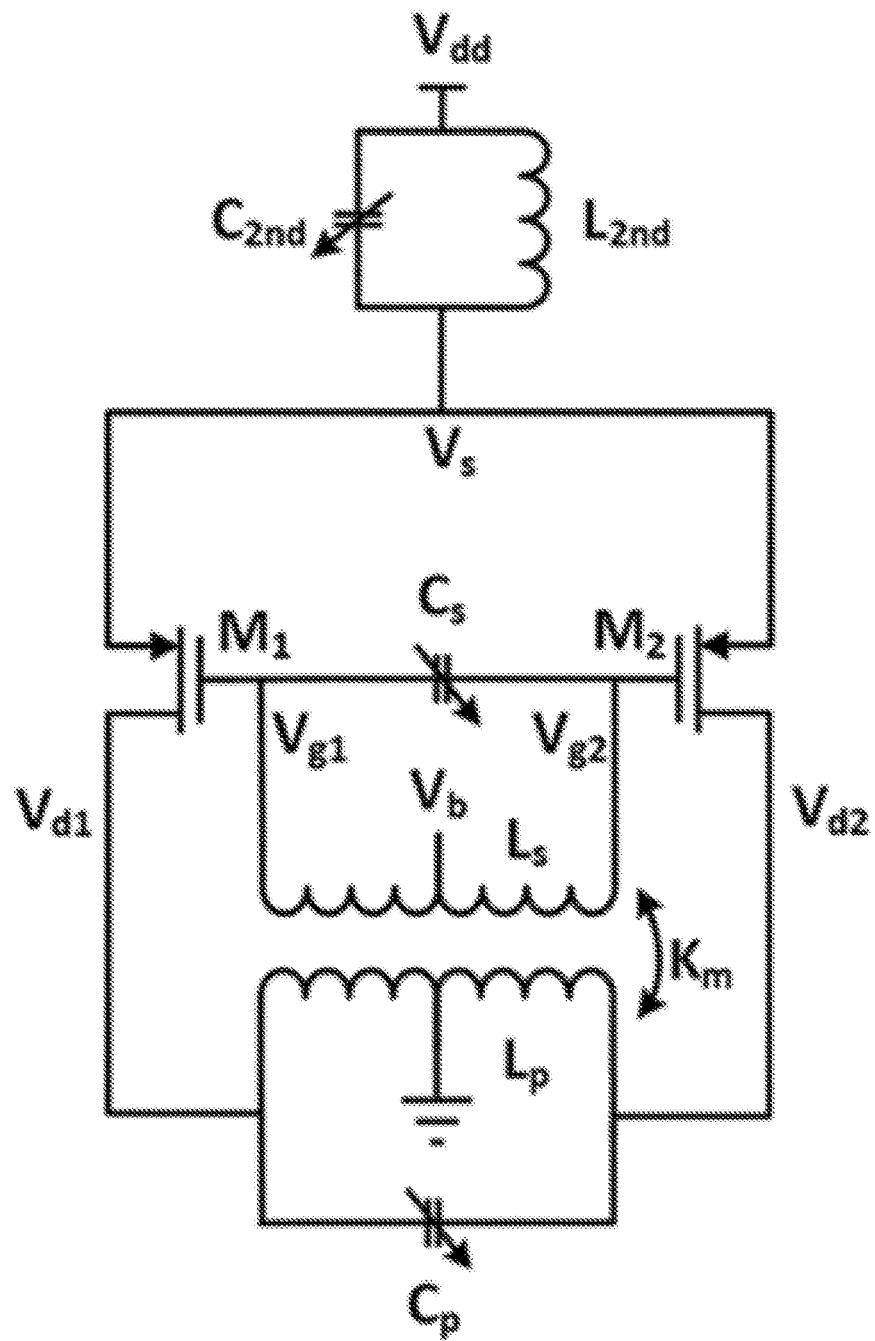
Figure 2C:
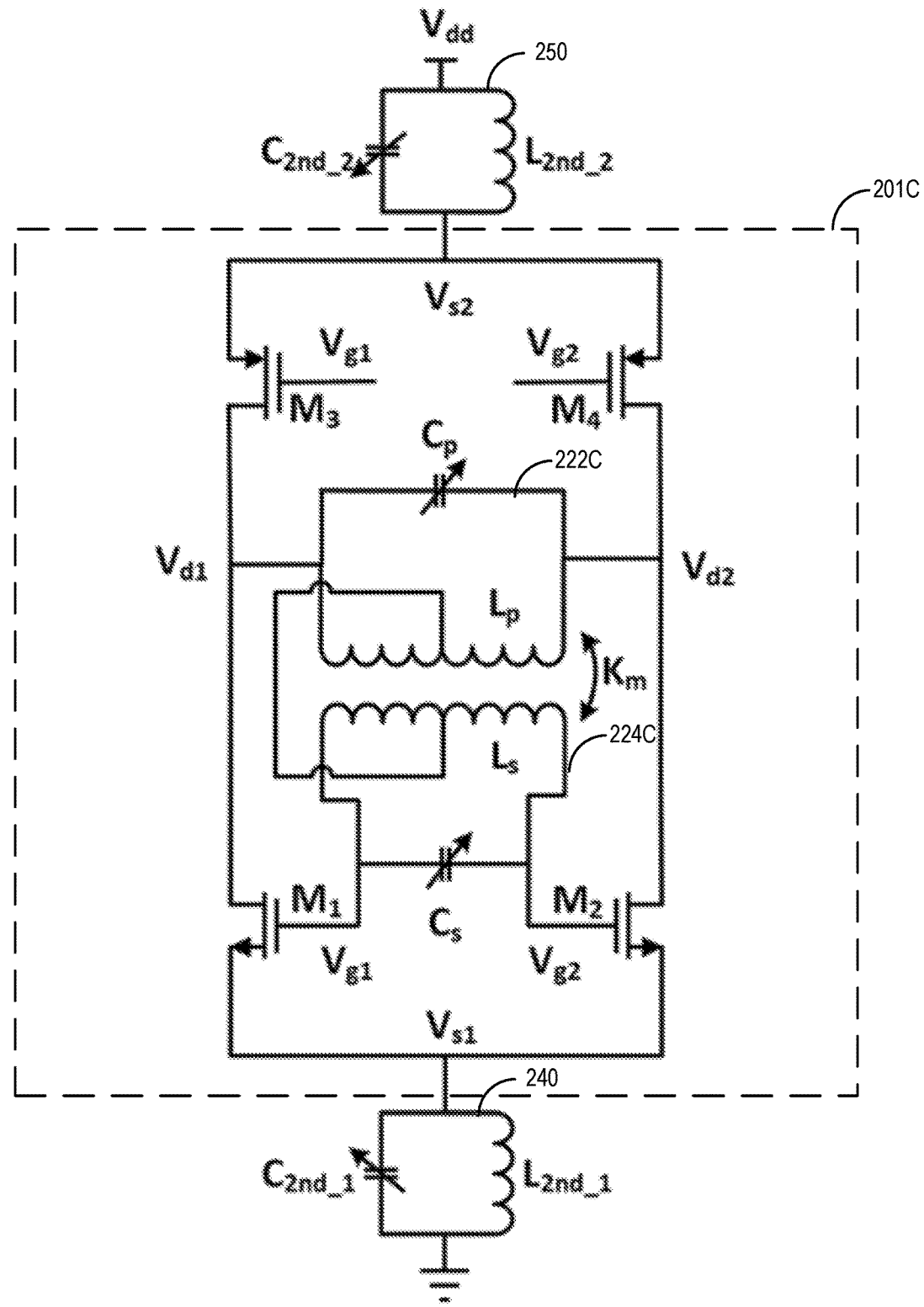

VCOs shown in FIGS. 2A-2C may be part of the clock system of headphone 104 or user device 102 for generating clock signals for modulating/demodulating the data (e.g., data packet(s) representing the audio information). In some embodiments, the VCO may use a direct current (DC) voltage as the input and may output a differential voltage signal with certain oscillation frequency (e.g., the resonant frequency of the VCO). To have better phase noise performance, the oscillator may generate the clock signal based on enforcing a pseudo-square voltage waveform around LC tank(s) by increasing the third harmonic of the fundamental oscillation voltage through an additional impedance peak. To increase the $V_{dH3}/V_{dH1}$ of the output signal, the VCO disclosed herein includes additional tail tank circuit(s) (e.g., one tail tank when using p-channel metal-oxide-semiconductor (PMOS) or n-channel metal-oxide-semiconductor (NMOS), two tail tank circuits when using complementary metal—oxide—semiconductor (CMOS) by the active network to generate the activating signal for sustaining an oscillation of the VCO) with an input impedance peak at the second-harmonic frequency and/or fourth-harmonic frequency. The tail tank circuit(s) are connected to a main circuit of the VCO at a low impedance point (e.g., a point on the discharge path to the ground). As a result, when the current passes the tail tank circuit, a second-harmonic and/or fourth-harmonic of fundamental oscillation voltage can be generated and, when being mixed with the differential output of the main circuit, would increase the portion of the third-harmonic frequency component of the output voltage signal.

For example, as illustrated in FIG. 2A, VCO 200A includes an active network 210 configured to generate an activating signal for sustaining oscillation of VCO 200A, a passive differential network 220 operatively coupled to active network 210, and a tail tank circuit 230, connected to active network 210 at a low impedance point. Active network 210 may include a pair of transistors $M_1$ and $M_2$, each having a gate terminal (e.g., $g_1$ and $g_2$), a drain terminal (e.g., $d_1$ and $d_2$), and a source terminal (e.g., $s_1$ and $s_2$). Passive differential network 220 may include a primary winding 222 and a secondary winding 224. Each of primary winding 222 and secondary winding 224 has a pair of inductor and capacitor (e.g., each being an LC resonator for making the desired tank input impedance). For example, primary winding 222 may include an inductor $L_p$ and a capacitor $C_p$, secondary winding 224 may include an inductor $L_s$ and a capacitor $C_s$ for creating a first input impedance magnitude peak at a first frequency and a second input impedance magnitude peak at a second frequency respectively. In some embodiments, $C_p$ and $C_s$ are adjustable (e.g., a tuning capacitor) such that the first frequency can be set as substantially a fundamental frequency of VCO 200A and the second frequency can be set as substantially a third harmonic frequency of VCO 200A.

In some embodiments, tail tank circuit 230 may include an inductor $L_{2nd}$ and a capacitor $C_{2nd}$ for creating a third input impedance magnitude peak at a third frequency. In some embodiments, $C_{2nd}$ is adjustable (e.g., a tuning capacitor) such that the third frequency can be set as substantially a second or fourth harmonic frequency of VCO 200A.

Because tail tank circuit 230 has the input impedance magnitude peak at the second or fourth harmonic frequency of VCO 200A and is connected to a low impedance point of VCO 200A, when the drain current passes, tail tank circuit 230 may create an output voltage signal $V_s$ at substantially a second-harmonic and/or fourth-harmonic of fundamental oscillation voltage. When mixing the output voltage signal Vs with the fundamental frequency component of the differential output of the main circuit, the portion of the third-harmonic frequency component of the output voltage signal of VCO 200A would be increased.

For example, active network 210 may include a pair of transistors $M_1$ and $M_2$, each having a gate terminal (e.g., $g_1$ and $g_2$), a drain terminal (e.g., $d_1$ and $d_2$), and a source terminal (e.g., $s_1$ and $s_2$). In some embodiments, transistors $M_1$ and $M_2$ may be NMOSs such as in VCO 200A, as illustrated in FIG. 2A. In some other embodiments, $M_1$ and $M_2$ may also be PMOSs such as in VCO 200B, as illustrated in FIG. 2B. As VCO 200A and VCO 200B have a mirror image circuit design, the circuit diagram of VCO 200B will not be repeated for simplicity as will be understood by a person of ordinary skill in the art.

As illustrated in FIG. 2A, primary winding 222 may be connected to transistors $M_1$ and $M_2$ at their drain terminals $d_1$ and $d_2$, respectively. Secondary winding 224 may be connected to transistors $M_1$ and $M_2$ at their gate terminals $g_1$ and $g_2$, respectively. In some embodiments, primary winding 222 and secondary winding 224 may be LC tanks and, when coupled together, may form a transformer-coupled class-F oscillator. In some embodiments, primary winding 222 may include inductor $L_p$ and capacitor $C_p$, for creating the first input impedance magnitude peak at the first frequency and secondary winding 224 may include inductor $L_s$ and capacitor $C_s$ for creating the second input impedance magnitude peak at the second frequency respectively. In some embodiments, $C_p$ and $C_s$ are adjustable (e.g., a tuning capacitor) such that the first frequency can be set as substantially a fundamental frequency of VCO 200A and the second frequency can be set as substantially a third harmonic frequency of VCO 200A. Thus, the ratio of the second frequency to the first frequency is approximately three.

Figure 3:
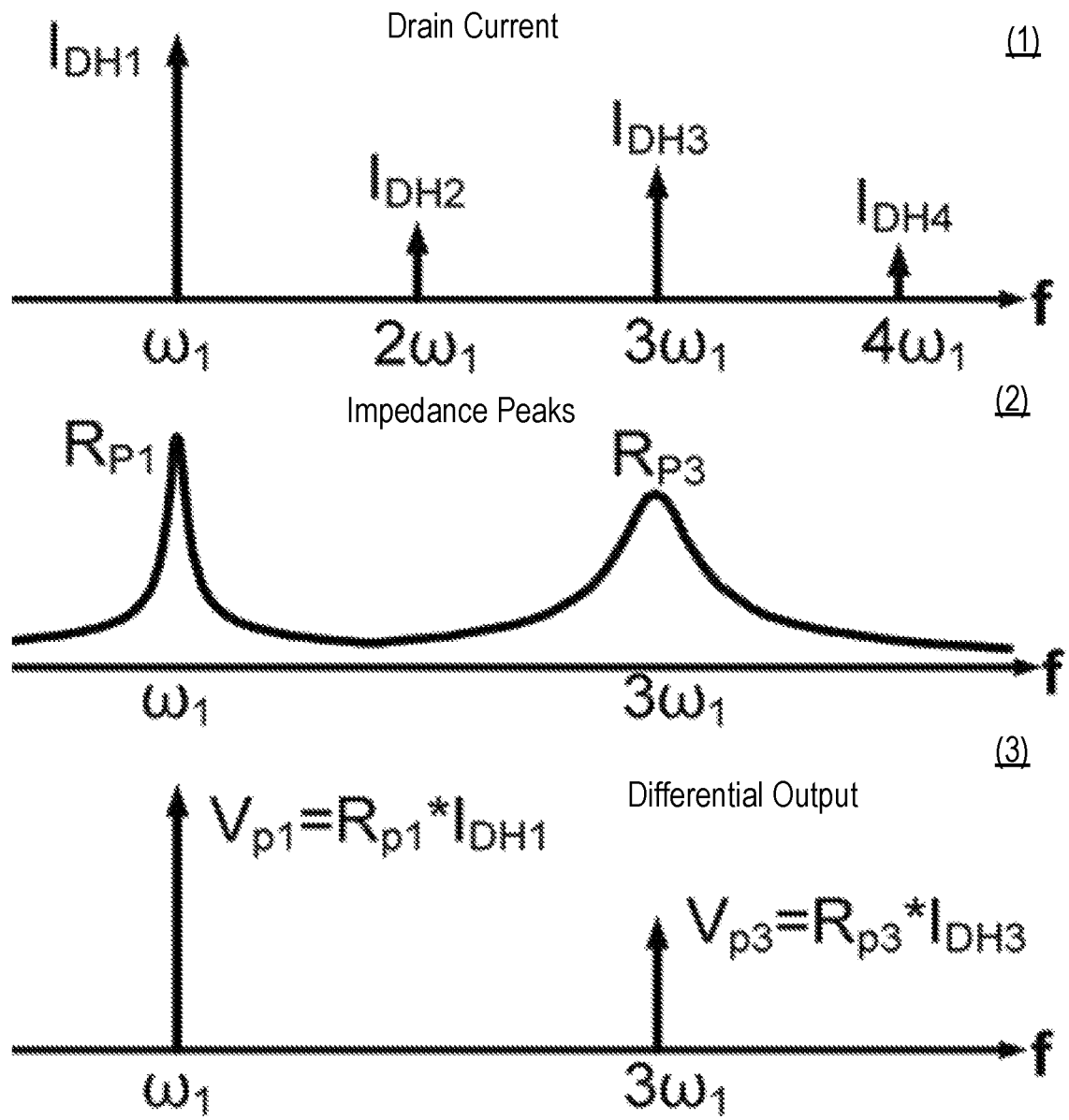
FIG. 3 illustrates waveforms of a main circuit of an exemplary VCO in frequency domain in accordance with some embodiments.

FIG. 3 illustrates waveforms of main circuit 201 of the exemplary VCO in frequency domains in accordance with various embodiments. In some embodiments, as illustrated in FIG. 3, the drain current of the transistors $M_1$ and $M_2$ may include both odd harmonic components and even harmonic components (only the first four harmonic components are shown in FIG. 3-(1) for illustrative purposes). When passes passive differential network 220, passive differential network 220 may filter out the harmonic components other than the fundamental frequency and the third harmonic frequency (e.g., corresponding to the input impedance peaks of primary and secondary windings 222 and 224) for generating the output voltage signal $V_p$ (e.g., the differential output of main circuit 201) with the pseudo-square voltage waveform around passive differential network 220 to improve the phase noise performance of VCO 200A. For example, passive differential network 220 may have the first input impedance peak at about the fundamental frequency (e.g., $\omega_1$) and the second impedance peak at about the third harmonic of the fundamental frequency (e.g., $3\omega_1$) as illustrated in FIG. 3-(2). The ratio of the second frequency (e.g., the second impedance peak) to the first frequency (e.g., the first impedance peak) is approximately three. Thus, when the drain current passes passive differential network 220, main circuit 201 may output voltage signal $V_p$ including the fundamental and third harmonic component of the fundamental oscillation voltage, as illustrated in FIG. 3-(3). Accordingly, the pseudo-square voltage waveform around passive differential network 220 may be generated as the output voltage signal $V_p$ of main circuit 201.

To further improve the third harmonic component of the fundamental oscillation voltage such that the zero-crossing slope of the pseudo-square voltage waveform can be sharper/steeper, an additional tank impedance peak at the second or fourth harmonic of the fundamental frequency is added to VCO 200A by adding tail tank circuit 230 to main circuit 201 through the impedance point of main circuit 201. For example, similar to primary winding 222 and secondary winding 224, tail tank circuit 230 may be an LC tank and may include inductor $L_{2nd}$ and capacitor $C_{2nd}$ for creating the third input impedance magnitude peak at the second and/or the fourth input impedance magnitude peak. In some embodiments, $C_{2nd}$ is adjustable (e.g., a tuning capacitor) such that the third frequency can be set as substantially a second and/or fourth harmonic frequency of VCO 200A.

According to what is illustrated in FIG. 3-(1), the drain current of the transistors $M_1$ and $M_2$ may also include the second and/or fourth harmonic components. Accordingly, when passes tail tank circuit 230, tail tank circuit 230 may filter out the harmonic components of the drain current other than the second and/or the fourth harmonic frequency. Tail tank circuit 230 may generate the output voltage signal $V_s$ with the second and/or fourth component of the fundamental oscillation voltage.

Figure 5:
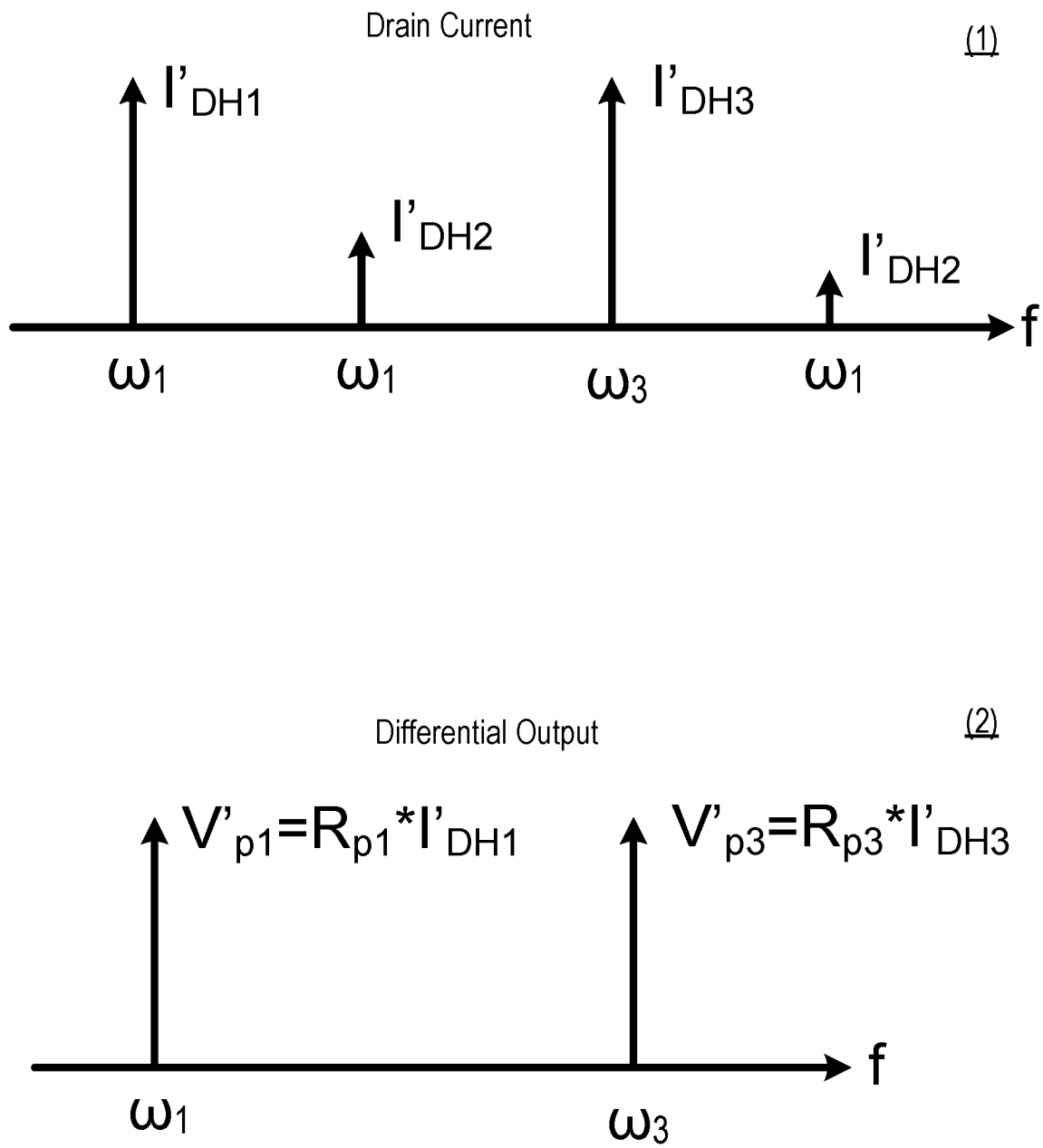
FIG. 5 illustrates waveforms of the exemplary VCO in frequency domain in accordance with some embodiments.

For example, tail tank circuit 230 may have the third input impedance peak at about the second and/or fourth harmonic of the fundamental frequency (e.g., $2\omega_1$ and/or $4\omega_1$). The ratio of the third frequency (e.g., the third impedance peak) to the first frequency (e.g., the first impedance peak) is approximately two and/or four. Thus, when the drain current passes tail tank circuit 230, it may output the voltage signal $V_s$ including the second and/or fourth component of the fundamental oscillation voltage. Accordingly, when mixing output voltage signal $V_s$ with the output voltage signal $V_p$, an additional third component of the fundamental oscillation voltage can be generated based on synthesizing the second and/or fourth component of the fundamental oscillation voltage of output voltage signal $V_s$ with the fundamental component of the fundamental oscillation voltage of output voltage signal $V_p$. For example, FIG. 5 illustrates waveforms of the exemplary VCO in frequency domains in accordance with various embodiments. As illustrated in FIG. 5, after mixing the output voltage signal $V_s$ with the output voltage signal $V_p$, the third harmonic component of the drain current of VCO 200A can be substantially increased (comparing to that in FIG. 3) as a result.

By adding more third harmonic component of the fundamental oscillation voltage to the output signal of VCO 200A Thus, the zero-crossing slope of the pseudo-square voltage waveform can be sharper, and VCO 200A can have improved phase noise performance while keeping the high-power efficiency of a conventional class-F oscillator. Moreover, the third harmonic component of the fundamental oscillation voltage can be used as clock signal(s) for System on Chip(s) (SoC(s)) for wireless communication, such as for modulation/demodulation, coding/decoding, transmitting/receiving the audio information etc. Using the third harmonic component of the fundamental oscillation voltage for generating the clock signals may reduce the pulling effect caused by the power amplifier (PA) in the subsequent circuit by staggering the operating frequencies for different modules of the SoC (e.g., using different clock signals, not being a integer multiple for the clock signal used by the PA). This can further improve the accuracy of the SoC for processing the audio information.

In some embodiments, the VCO disclosed herein can use CMOSs for generating the activating signal for sustaining the oscillation of the VCO. For example, as illustrated in FIG. 2C, VCO 200C may include transistors $M_1$, $M_2$, $M_3$, and $M_4$ with transistors $M_1$ and $M_2$ being NMOSs and transistors $M_3$ and $M_4$ being PMOSs.

Primary winding 222C may be connected to transistors $M_1$, $M_2$, $M_3$, and $M_4$ at their drain terminals $d_1$ and $d_2$, respectively. Secondary winding 224C may be connected to transistors $M_1$ and $M_2$ at their gate terminals $g_1$ and $g_2$, respectively. Similar to VCO 200A, primary winding 222C and secondary winding 224C may be LC tanks and, when coupled together, may form a transformer-coupled class-F oscillator. In some embodiments, primary winding 222 may include inductor $L_p$ and capacitor $C_p$, for creating the first input impedance magnitude peak at a first frequency and secondary winding 224C may include inductor $L_s$ and capacitor $C_s$ for creating a second input impedance magnitude peak at the second frequency respectively. In some embodiments, $C_p$ and $C_s$ are adjustable (e.g., a tuning capacitor) such that the first frequency can be set as substantially a fundamental frequency of VCO 200C, and the second frequency can be set as substantially a third harmonic frequency of VCO 200C.

VCO 200C may include a first tail tank circuit 240 and a second tail tank circuit tank 250, each connected to main circuit 201C at a low impedance point. Similar to tail tank circuit 230 in VCO 200A, tail tank circuit 240 and 250 may be LC tanks. Tail tank circuit 240 may include inductor $L_{2nd\_1}$ and capacitor $C_{2nd\_1}$, for creating the third input impedance magnitude peak at a third frequency, and Tail tank circuit 240 may include inductor $L_{2nd\_2}$ and capacitor $C_{2nd\_2}$ for creating the fourth input impedance magnitude peak at a fourth frequency respectively. In some embodiments, $C_{2nd\_1}$ and $C_{2nd\_2}$ are adjustable (e.g., a tuning capacitor) such that the third and fourth frequencies can be set as substantially a second and/or the fourth harmonic frequency of VCO 200C.

VCO 200C can generate an additional third component of the fundamental oscillation voltage, similar to the mechanism disclosed above and will not be repeated for simplicity as will be understood by a person of ordinary skill in the art. By using the CMOSs instead of using the NMOSs or PMOSs (e.g., more transistors involved) for providing the activating signal for the VCO, the gain of the VCO can be increased at the cost of a reduced dynamic range of the VCO.

Figure 4:
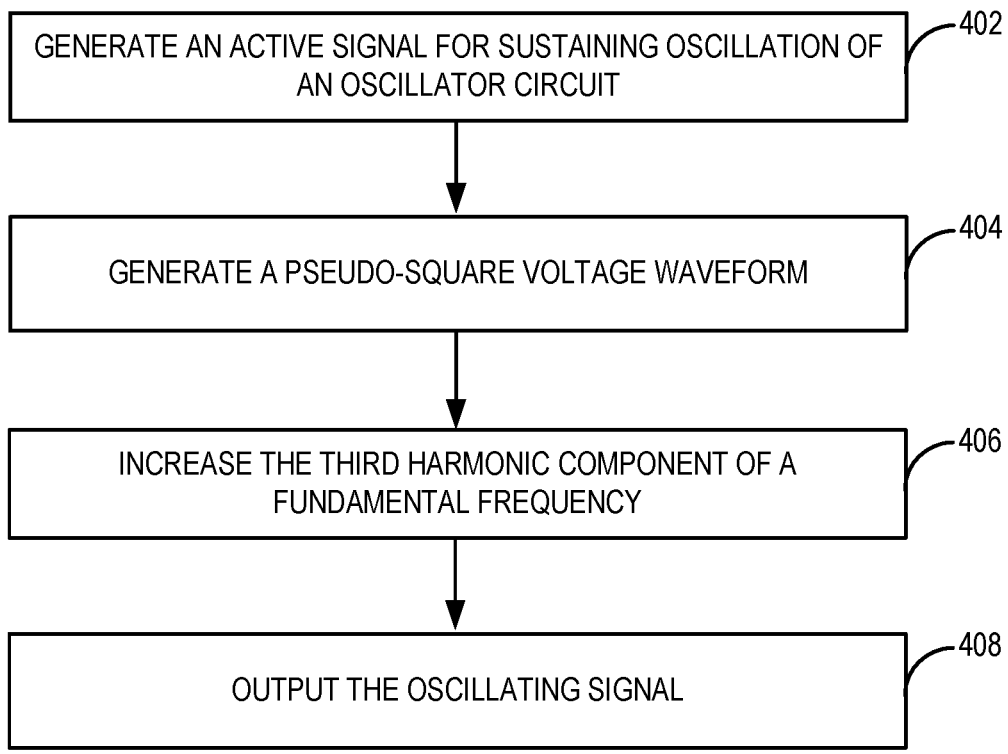
FIG. 4 is a flow chart illustrating an exemplary method for generating oscillating signals in accordance with some embodiments.

FIG. 4 is a flow chart illustrating an exemplary method 400 for generating a clock signal using a voltage-controlled oscillator (VCO) in accordance with an embodiment. Method 400 can be performed by processing logic that can comprise hardware (e.g., circuitry, dedicated logic, programmable logic, microcode, etc.), software (e.g., instructions executed on a processing device), or a combination thereof. It is to be appreciated that not all operations may be needed to perform the disclosure provided herein. Further, some of the operations may be performed simultaneously, or in a different order than shown in FIG. 4, as will be understood by a person of ordinary skill in the art.

Method 400 shall be described with reference to FIGS. 1, 2, and 3. However, method 400 is not limited to that exemplary embodiment. In method 400, an additional third component of the fundamental oscillation voltage can be generated based on synthesizing the second and/or fourth component of the fundamental oscillation voltage of an output voltage signal of a tail tank circuit and fundamental component of the fundamental oscillation voltage of an output voltage signal of the main circuit (e.g., a conventional class-F oscillator). Thus, the zero-crossing slope of the pseudo-square voltage waveform can be sharper, and the clock signal generated herein can have improved phase noise performance while keeping the high-power efficiency of the conventional class-F oscillator.

Starting at step 402, an activating signal for sustaining oscillation of an oscillator circuit is generated by an active network. In some embodiments, the active network comprises a pair of transistors, each having a gate terminal, a drain terminal, and a source terminal.

In step 404, a pseudo-square voltage waveform is generated by a passive differential network operatively coupled to the active network. For example, the passive differential network may include a primary winding and a secondary winding. Each of the primary and the secondary winding has a pair of inductor and capacitor (e.g., each being an LC resonator for making the desired tank input impedance). In some embodiments, capacitors of the primary and the secondary winding are adjustable (e.g., a tuning capacitor) such that the first frequency can be set as substantially a fundamental frequency of the VCO and the second frequency can be set as substantially a third harmonic frequency of the VCO.

In some embodiments, the primary winding may be connected to the pair of transistors at their drain terminals, respectively. The Secondary winding may be connected to the pair of transistors at their gate terminals, respectively. In some embodiments, the primary and the secondary winding may be LC tanks and, when coupled together, may form a transformer-coupled class-F oscillator. In some embodiments, the primary and the secondary winding have the first input impedance magnitude peak at a first frequency and a second input impedance magnitude peak at the second frequency, respectively. In some embodiments, the capacitors of the primary and the secondary winding are adjustable (e.g., a tuning capacitor) such that the first frequency can be set as substantially a fundamental frequency of the VCO and the second frequency can be set as substantially a third harmonic frequency of the VCO.

In some embodiments, the drain current of the transistors may include both odd harmonic components and even harmonic components. When passes the passive differential network, the harmonic components in the drain current other than the fundamental frequency and the third harmonic frequency (e.g., corresponding to the first input impedance magnitude peak and the second input impedance magnitude peak) may be filtered out by the passive differential network for generating the output voltage signal $V_p$ with the pseudo-square voltage waveform around the passive differential network. Generating the output voltage signal $V_p$ with the pseudo-square voltage waveform may improve the phase noise performance of the VCO. For example, the passive differential network may have the first input impedance peak at about the fundamental frequency (e.g., $\omega_1$) and the second impedance peak at about the third harmonic of the fundamental frequency (e.g., $3_{\omega 1}$). The ratio of the second frequency (e.g., corresponding to the second impedance peak) to the first frequency (e.g., corresponding to the first impedance peak) is approximately three. Thus, when the drain current passes the passive differential network, the main circuit of the VCO (i.e., the VCO circuit except for the tail tank circuit) may output voltage signal $V_p$ including the fundamental and third harmonic components of the fundamental oscillation voltage. Accordingly, the generated output voltage signal of the main circuit $V_p$ may have the pseudo-square voltage waveform around the passive differential network.

In step 406, additional third component of the fundamental oscillation voltage can be generated by a tail tank circuit. For example, an additional tank impedance peak at the second or fourth harmonic of the fundamental frequency is added to the VCO by connecting the tail tank circuit to the impedance point of the main circuit. For example, the tail tank circuit may be an LC tank and may include a pair of inductor and capacitor for creating the third input impedance magnitude peak at the second and/or the fourth input impedance magnitude peak. In some embodiments, the capacitor is adjustable (e.g., a tuning capacitor) such that the third frequency can be set as substantially a fourth harmonic frequency of the VCO.

As illustrated in FIG. 3-(1), the drain current of the transistors may also include the second and/or fourth harmonic components. Thus, when passes passive the tail tank circuit, the harmonic components of the drain current other than the second and/or the fourth harmonic frequency may be filtered out by the tail tank circuit for generating the output voltage signal $V_s$ including the second and/or fourth component of the fundamental oscillation voltage. For example, the tail tank circuit may have the third input impedance peak at about the second and/or fourth harmonic of the fundamental frequency (e.g., $2_{\omega 1}$ and/or $4_{\omega 1}$). The ratio of the third frequency (e.g., corresponding to the third impedance peak) to the first frequency (e.g., corresponding to the first impedance peak) is approximately two and/or four. Thus, when the drain current passes the tail tank circuit, it may output the voltage signal $V_s$ including the second and/or fourth component of the fundamental oscillation voltage. Accordingly, when mixing output voltage signal $V_s$ with the output voltage signal $V_p$, an additional third component of the fundamental oscillation voltage can be generated based on synthesizing the second and/or fourth component of the fundamental oscillation voltage of the output voltage signal $V_s$ with the fundamental component of the fundamental oscillation voltage of the output voltage signal $V_p$.

In step 408, the oscillating signal (e.g., the differential output voltage mixed with output signal $V_s$) is outputted by the VCO. For example, the oscillating signal may be used as a clock signal for performing functions such as modulating/demodulating audio information according to different wireless communication protocols.

As the third harmonic component of the output signal is significantly increased, the zero-crossing slope of the pseudo-square voltage waveform can be sharper, and the VCO disclosed herein can have improved phase noise performance while keeping the high-power efficiency of a conventional class-F oscillator.

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure or the appended claims in any way.

While the present disclosure has been described herein with reference to exemplary embodiments for exemplary fields and applications, it should1 be understood that the present disclosure is not limited thereto. Other embodiments and modifications thereto are possible, and are within the scope and spirit of the present disclosure. For example, and without limiting the generality of this paragraph, embodiments are not limited to the software, hardware, firmware, and/or entities illustrated in the figures and/or described herein. Further, embodiments (whether or not explicitly described herein) have significant utility to fields and applications beyond the examples described herein.

Embodiments have been described herein with the aid of functional building blocks illustrating the implementation of specified functions and relationships thereof. The boundaries of these functional building blocks have been arbitrarily defined herein for the convenience of the description. Alternate boundaries can be defined as long as the specified functions and relationships (or equivalents thereof) are appropriately performed. Also, alternative embodiments may perform functional blocks, steps, operations, methods, etc. using orderings different than those described herein.

The breadth and scope of the present disclosure should not be limited by any of the above-described exemplary embodiments, but should be defined only in accordance with the following claims and their equivalents.

What is claimed is:

1. An oscillator circuit for generating a pseudo-square voltage waveform, comprising:
   an active network configured to generate an activating signal for sustaining oscillation of the oscillator circuit;
   a passive differential network coupled to the active network, wherein the passive differential network has a first input impedance magnitude peak at substantially a first harmonic frequency of the oscillator circuit and a second input impedance magnitude peak at substantially a third harmonic frequency of the oscillator circuit; and
   a tail tank circuit coupled to the active network through a low impedance point of the active network, wherein the tail tank circuit has a third input impedance magnitude peak at substantially a second or fourth harmonic frequency of the oscillator circuit, and the tail tank circuit is configured to generate an output signal having a component of the second or fourth harmonic frequency of the oscillator circuit.

2. The oscillator circuit of claim 1, further comprising a Class F oscillator configured to generate the pseudo-square voltage waveform based on the component of the second or fourth harmonic frequency of the oscillator circuit generated by the tail tank circuit.

3. The oscillator circuit of claim 1, wherein the active network comprises a pair of transistors, each having a gate terminal, a drain terminal, and a source terminal.

4. The oscillator circuit of claim 3, wherein the passive differential network comprises a primary winding and a secondary winding, and wherein the primary winding is coupled to the drain terminals of the pair of transistors, and the secondary winding is coupled to the gate terminals of the pair of transistors.

5. The oscillator circuit of claim 3, wherein the passive differential network further comprises at least one tuning capacitor configured to control the first input impedance magnitude peak and the second input impedance magnitude peak.

6. The oscillator circuit of claim 5, wherein the tail tank circuit comprises at least one tuning capacitor configured to control the third input impedance magnitude peak.

7. The oscillator circuit of claim 3, wherein the tail tank circuit is coupled to the source terminals of the pair of transistors.

8. The oscillator circuit of claim 3, wherein the pair of transistors comprises at least one of an N-type metal-oxide-semiconductor (NMOS), a P-type metal-oxide-semiconductor (PMOS), or a complementary metal-oxide-semiconductor (CMOS).

9. A voltage-controlled oscillator (VCO) for generating a pseudo-square voltage waveform, comprising:
   a pair of transistors configured to generate an activating signal for sustaining oscillation of the VCO;
   a passive differential network comprising a transformer operatively coupled to the pair of transistors, wherein the passive differential network has a first input impedance magnitude peak at substantially a first harmonic frequency of the VCO and a second input impedance magnitude peak at substantially a third harmonic frequency of the VCO; and
   a tail tank circuit, coupled to the pair of transistors at a low impedance point of the VCO, wherein the tail tank circuit has a third input impedance magnitude peak at substantially a second or fourth harmonic frequency of the VCO, and the tail tank circuit is configured to generate an output signal having a component of the second or fourth harmonic frequency.

10. The VCO of claim 9, further comprising a Class F oscillator configured to generate the pseudo-square voltage waveform based on the component of the second or fourth harmonic frequency of the VCO generated by the tail tank circuit.

11. The VCO of claim 9, wherein
   the pair of transistors, each having a gate terminal, a drain terminal, and a source terminal; and
   the transformer comprises a primary winding and a secondary winding, wherein the primary winding is coupled to the drain terminals of the pair of transistors, and the secondary winding is coupled to the gate terminals of the pair of transistors.

12. The VCO of claim 11, wherein the tail tank circuit is coupled to the source terminals of the pair of transistors.

13. The VCO of claim 9, wherein the transformer further comprises at least one tuning capacitor configured to control the first input impedance magnitude peak and the second input impedance magnitude peak.

14. The VCO of claim 9, wherein the tail tank circuit comprises at least one tuning capacitor configured to control the third input impedance magnitude peak.

15. The VCO of claim 9, wherein the pair of transistors comprises at least one of an N-type metal-oxide-semiconductor (NMOS), a P-type metal-oxide-semiconductor (PMOS), or a complementary metal-oxide-semiconductor (CMOS).

16. A method for generating a pseudo-square voltage waveform using a voltage-controlled oscillator (VCO), comprising:
   generating, by an active network, an activating signal for sustaining oscillation of an oscillator circuit;
   generating, by a passive differential network coupled to the active network, the pseudo-square voltage waveform, wherein the passive differential network has a first input impedance magnitude peak at substantially a first harmonic frequency of the VCO and a second input impedance magnitude peak at substantially a third harmonic frequency of the VCO; and increasing a component of the third harmonic frequency of the VCO in the passive differential network using a tail tank circuit coupled to the active network through a low impedance point of the active network, wherein the tail tank circuit has a third input impedance magnitude peak at substantially a second or fourth harmonic frequency of the VCO, and the tail tank circuit is configured to generate an output signal having a component of the second or fourth harmonic frequency of the VCO.

17. The method of claim 16 wherein the active network comprises a pair of transistors, each having a gate terminal, a drain terminal, and a source terminal; and the passive differential network comprises a primary winding and a secondary winding, wherein the primary winding is coupled to the drain terminals of the pair of transistors, and the secondary winding is coupled to the gate terminals of the pair of transistors.

18. The method of claim 17, further comprising controlling the first input impedance magnitude peak and the second input impedance magnitude peak using at least one tuning capacitor.

19. The method of claim 17, further comprising generating the output signal having the component of the second or fourth harmonic frequency by the tail tank circuit based on receiving a current from the source terminals of the pair of transistors.

20. The method of claim 16, further comprising controlling the third input impedance magnitude peak of the tail tank circuit using at least one tuning capacitor.

* * * * *